United States Patent [19]

Morehouse et al.

[11] 4,325,099

[45] Apr. 13, 1982

[54] DETECTOR CIRCUIT FOR THYRISTORS

[75] Inventors: James E. Morehouse; Richard A. Pedersen, both of New Tripoli, Pa.

[73] Assignee: Bell Telephone Laboratories, Incorporated, Murray Hill, N.J.

[21] Appl. No.: 195,334

[22] Filed: Oct. 9, 1980

[51] Int. Cl.³ .......................................... G01R 19/165
[52] U.S. Cl. ............................... 361/93; 307/252 R; 340/653
[58] Field of Search ................... 361/91, 100, 205, 93; 307/252 R, 252 C, 252 J, 252 N; 340/635, 645, 653

[56] References Cited

U.S. PATENT DOCUMENTS

| | | | |
|---|---|---|---|
| 3,424,972 | 1/1969 | Ekstrom et al. | 307/252 J X |
| 4,071,780 | 1/1978 | Burnett | 307/252 J X |
| 4,217,618 | 8/1980 | Kellenbenz et al. | 307/252 R X |

*Primary Examiner*—Harry E. Moose, Jr.
*Attorney, Agent, or Firm*—P. Visserman

[57] ABSTRACT

A detector circuit (102) is connected to the gate of a thyristor (103) for generating an output signal indicating the presence of current flowing out of the cathode of the thyristor. A switch circuit (101), which is responsive to a control signal, selectively applies the control signal in a first state to the gate and, when the control signal is in a second state, connects the detector circuit to the gate to detect current flowing out of the gate of the thyristor.

10 Claims, 2 Drawing Figures

DETECTOR CIRCUIT FOR THYRISTORS

TECHNICAL FIELD

This invention relates generally to semiconductor switching circuits and, more particularly, to detector circuits for thyristors.

BACKGROUND OF THE INVENTION

One well-known thyristor is the silicon controlled rectifier (SCR). The SCR is a unilateral conducting device and has three terminals: an anode, a cathode, and a gate. Applying a control signal to the gate causes the SCR to switch to a low impedance state, which permits current to flow out of the cathode.

In one application where large numbers of serially connected SCRs are used in the control circuit of a telephone switching network, it is desirable to verify the desired operation of the control circuit and to assist in the identification and location of faults therein. One prior art arrangement monitors the total load current of the control circuit to determine how many devices are conducting current, but is unable to identify which devices are conducting current. Another prior art arrangement monitors current flowing to the gates of a group of devices, but is unable to determine how many or identify which devices are conducting current. Still another prior art arrangement detects current flowing out of the cathode of each device to verify the desired operation of the control circuit and to assist in the identification and location of faults therein. In this arrangement, an additional wire is typically connected to the cathode of each device to detect current flowing out of the cathode. In applications where large numbers of SCRs are used, these additional wires severely limit the number of individual SCR control circuits that can be integrated into a single integrated circuit package due to the limited number of terminals on the package. This typically increases the cost of the overall circuit. Furthermore, when used with a telephone switching network, these additional wires may also pick up extraneous signals to cause false indications.

SUMMARY OF THE INVENTION

In accordance with this invention, an output signal indicating the presence of current flowing out of the cathode terminal of a thyristor is generated by a detector circuit, coupled to the gate terminal of the thyristor, which detects current greater than a predetermined magnitude flowing out of the gate terminal, without the necessity of integrated circuit package terminals to detect current flowing out of the cathode terminal. One illustrative embodiment of the invention comprises a switch circuit responsive to a control signal to selectively apply the control signal and connect the detector circuit to the gate terminal of the thyristor.

In accordance with one aspect of this invention, the switch circuit comprises a first and second switching transistor for selectively applying the control signal and connecting the detector circuit to the gate terminal of the thyristor. When the control signal is in one state, the first and the second switching transistors are in a low and a high impedance state, respectively, and the control signal is applied to the gate terminal. On the other hand, when the control signal is in the second state, the first and second switching transistors are in the high and the low impedance state, respectively, and the detector circuit is connected to the gate terminal to detect current flowing out of the gate terminal.

In accordance with another aspect of this invention, the detector circuit comprises a first and a second voltage divider and a comparator. A comparator input voltage, which is generated by the first voltage divider in response to the current flowing out of the gate terminal, is compared to a reference voltage, which is generated by the second voltage divider. When the magnitude of the comparator input voltage is greater than the magnitude of the reference voltage, the comparator generates an output signal, which indicates that current is flowing out of the cathode terminal of the thyristor.

BRIEF DESCRIPTION OF THE DRAWING

The invention may be better understood from the following detailed description when read with reference to the drawing in which.

DETAILED DESCRIPTION

Figure 1:
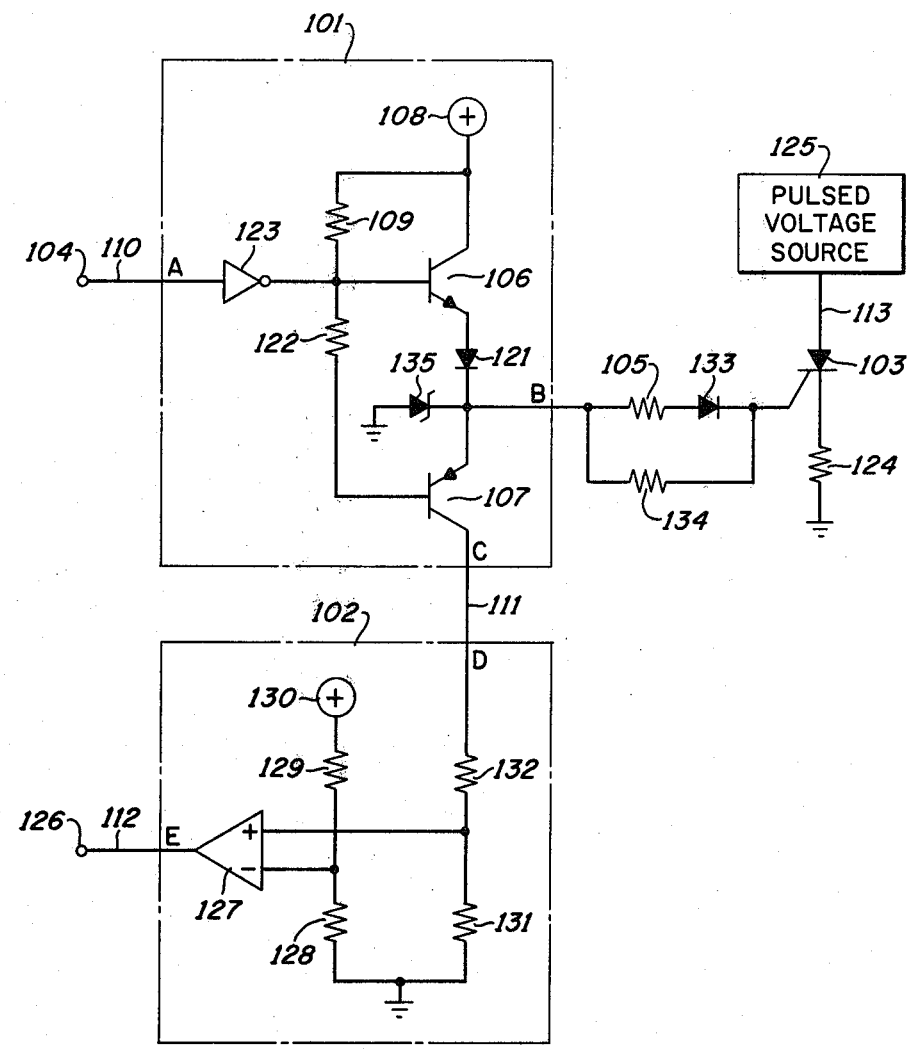
FIG. 1 represents an illustrative embodiment of a circuit in accordance with this invention.

One illustrative embodiment of the circuit in accordance with this invention, comprising a switch circuit 101, a detector circuit 102, and a silicon controlled rectifier (SCR) 103 having three terminals (an anode, a cathode, and a gate), is shown in FIG. 1. To indicate the presence of current flowing from the cathode of SCR 103, detector circuit 102 is connected by switch circuit 101 to the gate of SCR 103. Switch circuit 101 is operated in response to a control signal, having a high and a low logic level state, which may be applied to input terminal 104. When the control signal is in the low logic level state, switch circuit 101 applies a control current to the gate to cause SCR 103 to assume a low impedance state. A well-known pulsed voltage source 125 applies a positive voltage pulse of predetermined duration to the anode of SCR 103 while it is in the low impedance state, via conductor 113. As a result, SCR 103 latches into the low impedance state and source current flows for the predetermined period of time out of the cathode through load resistor 124 to ground. When the control signal is in the high logic level state, detector circuit 102 is connected by switch circuit 101 to the gate of SCR 103 to detect source current flowing out of the gate, which indicates the presence of source current flowing out of the cathode.

Switch circuit 101 has control terminal A, common terminal B, and output terminal C, and is used to selectively connect common terminal B between positive voltage source 108, which may be, for example 15 volts, and output terminal C, in response to the control signal applied to control terminal A. When the control signal is in the low logic level state, a signal path is established between positive voltage source 108 and common terminal B, and control current is applied to the gate of SCR 103. When the control signal is in the high logic level state, another signal path is established between output terminal C and common terminal B to connect detector circuit 102 to the gate of SCR 103. Control terminal A is connected to an input terminal 104 of the circuit via conductor 110. Common terminal B is connected to the gate of SCR 103 via current limiting resistor 134 in parallel with the serial combination of current limiting resistor 105 and protection diode 133, and output terminal C is connected via conductor 111 to input terminal D of detector circuit 102.

One illustrative embodiment of switch circuit 101, comprising NPN switching transistor 106 and PNP switching transistor 107, is shown in FIG. 1. The collector and base of transistor 106 are connected to positive voltage source 108, the base connected through a voltage pull-up resistor 109. The emitter of transistor 106 is connected via protection diode 121 to common terminal B, voltage regulating diode 135, and the emitter of transistor 107. The collector of transistor 107 is connected to output terminal C, and the base is connected to the base of transistor 106 via current limiting resistor 122. Control terminal A is connected to the base of transistor 106 via inverting buffer gate 123, which is used primarily to provide a proper signal level to other components of switch circuit 101. When a control signal in the low logic level state is applied to input terminal 104 of the circuit, a high level voltage is developed on the output terminal of inverting buffer gate 123 and causes transistors 106 and 107 to assume a low and a high impedance state, respectively. Hence, a control current flows from positive voltage source 108 through transistor 106 into the gate and causes SCR 103 to assume the low impedance state. When the control signal is in the high logic level state, a near zero level voltage is developed on the output terminal of inverting buffer gate 123 and causes transistors 106 and 107 to assume the high and the low impedance state, respectively. Thus, detector circuit 102 is connected via transistor 107 to the gate of SCR 103 to detect the flow of source current out of the gate.

Detector circuit 102 has input terminal D and output terminal E and is used to generate an output signal indicating the presence of source current flowing out of the cathode of SCR 103. Output terminal E of detector circuit 102 is connected to output terminal 126 of the circuit via conductor 112.

One illustrative embodiment of detector circuit 102, comprising comparator 127 and a first and second voltage divider, is shown in FIG. 1. Comparator 127 has a plus and a minus input terminal and an output terminal and is used to generate an output signal having a high and a low logic level state. The output terminal of comparator 127 is directly connected to output terminal E of detector circuit 102. A reference voltage VR, which may be, for example, 0.9 volts, is applied by the second voltage divider to the minus input terminal of comparator 127. Reference voltage VR is established by voltage divider resistors 128 and 129 connected to the minus input terminal of comparator 127 and a positive voltage source 130, which may be, for example 15 volts. A comparator input voltage VC, which is the voltage drop across voltage divider resistor 131, is applied by the first voltage divider to the plus input terminal and compared to reference voltage VR. Comparator input voltage VC is caused by source current flowing out of the gate of SCR 103 through voltage divider resistor 131. Voltage divider resistor 131 is connected to input terminal D of detector circuit 102 via voltage divider resistor 132 and to the plus input terminal of comparator 127. When comparator input voltage VC is greater than reference voltage VR, the output signal is in the high logic level state indicating the presence of source current flowing out of the cathode of SCR 103. When comparator input voltage VC is less than reference voltage VR, the output signal is in the low logic level state indicating the absence of source current flowing out of the cathode of SCR 103. Thus, when detector circuit 102 is connected to the gate of SCR 103, the output signal present on output terminal 126 of the circuit may be utilized to indicate the presence and absence of source current flowing out of the cathode of SCR 103 without having to provide terminals on an integrated circuit package to detect current flowing out of the cathode.

Figure 2:
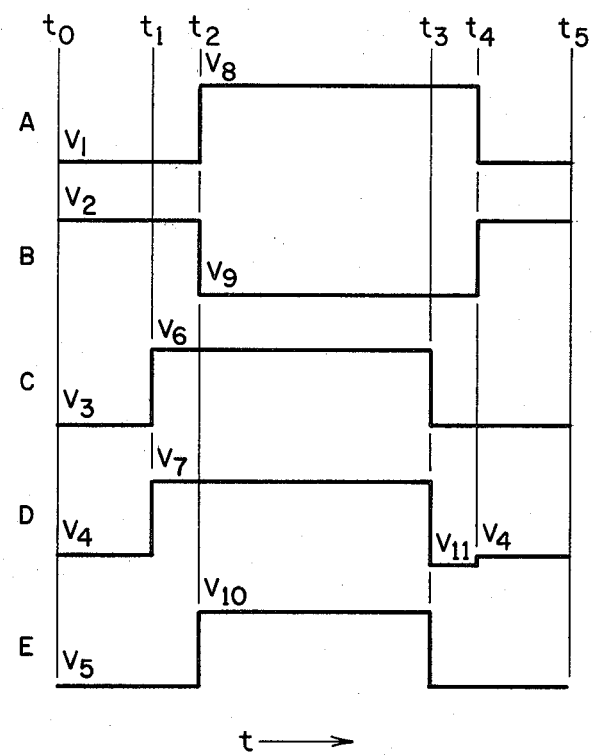
FIG. 2 is a diagram of idealized signals, plotted with respect to time, depicting graphically certain of the operations of the circuit of FIG. 1.

The operation of the circuit of FIG. 1 may be better understood with reference to the timing diagram of FIG. 2. Adjacent to the designation A in FIG. 2, between times $t_0$, and $t_5$, is a graphical representation of an idealized control signal A, which has a high and a low logic level state and is applied to input terminal 104 of the circuit. At time $t_0$, control signal A is in the low logic level state and is at a near zero voltage level $V_1$, which may be, for example, 0.4 volts. A high voltage level $V_2$, which may be, for example, 14 volts is developed on the output terminal of inverting buffer gate 123. Voltage level $V_2$ depends on the voltage level of positive voltage source 108 and on the resistance of voltage pull-up resistor 109. A graphical representation of an idealized gate output signal B, which is the voltage on the output terminal of inverting buffer gate 123, is depicted in FIG. 2, adjacent to the designation B. With gate output signal B at high voltage level $V_2$, transistor 106 assumes the low impedance state, whereas transistor 107 assumes the high impedance state. A control current, for example, 10.5 ma., flows from positive voltage source 108 through transistor 106, protection diode 121, current limiting resistor 134 in parallel with the serial combination of current limiting resistor 105 and protection diode 133, SCR 103, and load resistor 124 to ground. The control current causes SCR 103 to assume the low impedance state. A zero voltage level $V_3$, which is present on the output terminal of pulsed voltage source 125, is applied to the anode of SCR 103. A graphical representation of an idealized source signal C, which is the voltage on the output terminal of pulsed voltage source 125, is depicted in FIG. 2, adjacent to the designation C. As a result, only control current flows out of the cathode of SCR 103 and causes the cathode to assume a low voltage level $V_4$, which may be, for example, 1 volt. A graphical representation of an idealized load signal D, which is the voltage on the cathode of SCR 103, is also depicted in FIG. 2, adjacent to the designation D. Very little, if any, control current flows through transistor 107, which is in the high impedance state, to input terminal D of detector circuit 102. Hence, comparator input voltage VC is less than reference voltage VR, and output terminal 126 of the circuit assumes low voltage level $V_5$, which may be, for example, 0.4 volts. A graphical representation of an idealized output signal E, which is the voltage on output terminal 126 of the circuit, is depicted in FIG. 2, adjacent to the designation E. However, when the control signal is in the low logic level state, output signal E is not indicative of the presence or absence of current flowing out of the cathode of SCR 103. Between times $t_0$ and $t_1$, the circuit is allowed to reach a steady state condition, and the voltage levels of signals A through E remain essentially the same as those at the time $t_0$.

At time $t_1$, source signal C on the anode of SCR 103 assumes high voltage level $V_6$, which may be, for example, 100 volts, and causes source current, for example, 990 ma., to flow out of the cathode. Thus, load signal D on the cathode assumes a high voltage level $V_7$, which may be, for example, 99 volts. Source current, for example, 4 ma., also flows out of the gate through current limiting resistor 134 and voltage regulating diode 135 to ground. Between times $t_1$ and $t_2$, the circuit is once again allowed to reach a steady state condition.

At time $t_2$, control signal A changes from low voltage level $V_1$ to high voltage level $V_8$, which may be, for example, 2.8 volts, thereby causing gate output signal B on the output terminal of gate 123 to assume near zero voltage level $V_9$, which may be, for example, 0.4 volts. Near zero voltage level $V_9$ causes transistors 106 and 107 to assume the high and the low impedance state, respectively. Hence, control current is no longer applied to the gate of SCR 103, and detector circuit 102 is connected to the gate to detect source current flowing out of the gate. Source current from the gate of SCR 103 flows through voltage divider resistor 131 and causes comparator input voltage VC, which may be, for example, 3.75 volts, to be greater than reference voltage VR. Output signal E on output terminal 126 of the circuit changes from low voltage level $V_5$ to high voltage level $V_{10}$, which may be, for example, 2.8 volts, and indicates the presence of source current flowing out of the cathode of SCR 103. Between times $t_2$ and $t_3$, control signal A is maintained at high logic level $V_8$, and source signal C is maintained at high voltage level $V_6$. Source current continues to flow out of the cathode and the gate of SCR 103, and load signal D on the cathode of SCR 103 and output signal E are maintained at high voltage levels $V_7$ and $V_{10}$, respectively. Hence, with SCR 103 latched in the low impedance state and source current flowing out of the cathode, output signal E continues to indicate the presence of source current flowing out of the cathode of SCR 103.

At time $t_3$, source signal C on the anode of SCR 103 changes from high voltage level $V_6$ to low voltage level $V_3$. Source current no longer flows out of the cathode and the gate of SCR 103, and load signal D on the cathode terminal assumes zero voltage level $V_{11}$. Comparator input voltage VC is once again less than reference voltage VR, and the output terminal 126 of the circuit assumes low voltage level $V_5$ indicating the absence of current flowing out of the cathode of SCR 103. Between times $t_3$ and $t_4$, the circuit is allowed to reach a steady state condition.

At time $t_4$, control signal A and gate output signal B assume low voltage level $V_1$ and high voltage level $V_2$, respectively, and control current is once again applied to the gate of SCR 103. Transistor 107 assumes the high impedanc state in effect disconnecting detector circuit 102 from the gate of SCR 103, and load signal D assumes near zero voltage level $V_4$. With detector circuit 102 disconnected from the gate of SCR 103, output signal E is no longer indicative of the presence or absence of source current flowing out of the cathode. Between times $t_4$ and $t_5$, the circuit is allowed to reach a steady state condition.

It will be appreciated that if voltage level $V_6$ is less than the voltage level of positive voltage source 108, protection diode 105, current limiting resistor 134, and voltage regulating diode 135 may be eliminated from the circuit without damage occurring to transistors 106 and 107 during the operation of the circuit. Of course, the resistance of current limiting resistor 105 and voltage divider resistors 131 and 132 would have to be adjusted accordingly.

It is to be understood that the above-described arrangement is merely an illustrative application of the principles of this invention and that numerous other arrangements may be devised by those skilled in the art without departing from the spirit and scope of the invention.

What is claimed is:

1. An electrical circuit comprising
   a thyristor (103) having an anode, a cathode, and a gate terminal and being switchable to a low impedance state in response to a control signal in a first state applied to said gate terminal, wherein a first and a second current are permitted to flow simultaneously out of said gate and said cathode terminals, respectively, when said thyristor is in said low impedance state,
   characterized in that said electrical circuit further comprises detector circuit means (102) coupled to said gate terminal for detecting said first current and for generating an output signal indicating the presence of said second current, when said first current is greater than a predetermined magnitude.

2. An electrical circuit as claimed in claim 1 further characterized in that said electrical circuit further comprises first switching means (106) operated responsive to said control signal for selectively applying said control signal to said gate terminal.

3. An electrical circuit as claimed in claim 1 further characterized in that said electrical circuit further comprises second switching means (107) operated responsive to said control signal for selectively coupling said detector means to said gate terminal.

4. An electrical circuit as claimed in claim 1 further characterized in that said electrical circuit further comprises switch circuit means (101) operated responsive to said control signal for selectively applying said control signal and coupling said detector means to said gate terminal.

5. An electrical circuit as claimed in claim 4 further characterized in that said switch circuit means comprises:
   first switching means (106) for applying said control signal in said first state to said gate terminal and
   second switching means (107) responsive to said control signal in said second state for coupling said detector circuit means to said gate terminal.

6. An electrical circuit as claimed in claim 5 further characterized in that said switch circuit means further comprises protection means (121) for protecting said first switching means from excessive voltage levels on said gate terminal.

7. An electrical circuit as claimed in claim 6 further characterized in that said switch circuit means further comprises inverting buffer means (123) for amplifying and applying said control signal to said first and said second switching means.

8. An electrical circuit as claimed in claim 7 further characterized in that said switch circuit means further comprises voltage regulating means (135) for protecting said protection means and said first and said second switching means from excessive voltage levels on said gate terminal.

9. An electrical circuit as claimed in claim 1, 4, or 8 further characterized in that said detector means comprises:
   means (131, 132) response to said first current for generating a comparator input voltage,
   means (128, 129, 130) for generating a reference voltage, and
   comparing means (127) for generating said output signal when the magnitude of said comparator input voltage is greater than the magnitude of said reference voltage.

10. An electrical circuit as claimed in claim 9 further characterized in that said electrical circuit further comprises means (105, 133, 134) for limiting the magnitude of said control signal and said first current.

* * * * *